United States Patent [19]
Ochiai

[11] 4,447,753
[45] May 8, 1984

[54] MINIATURE GT-CUT QUARTZ RESONATOR

[75] Inventor: Osamu Ochiai, Tokyo, Japan

[73] Assignee: Seiko Instruments & Elcectronics Ltd., Tokyo, Japan

[21] Appl. No.: 323,487

[22] Filed: Nov. 20, 1981

[30] Foreign Application Priority Data

| Mar. 25, 1981 | [JP] | Japan | 56-43371 |
| May 7, 1981 | [JP] | Japan | 56-68829 |
| Jun. 30, 1981 | [JP] | Japan | 56-102957 |

[51] Int. Cl.$^3$ .................................. H01L 41/04
[52] U.S. Cl. .............................. 310/312; 310/361; 310/368
[58] Field of Search ............... 310/312, 360, 361, 367, 310/368, 365–366

[56] References Cited

U.S. PATENT DOCUMENTS

| 4,035,674 | 7/1977 | Oguchi et al. | 310/312 X |
| 4,050,126 | 9/1977 | Ikeno et al. | 310/312 X |
| 4,156,156 | 5/1979 | Sweany et al. | 310/312 |
| 4,191,906 | 3/1980 | Kogure | 310/312 X |
| 4,350,918 | 9/1982 | Sato | 310/348 X |

FOREIGN PATENT DOCUMENTS

| 53-3178 | 1/1978 | Japan | 310/361 |
| 55-105420 | 8/1980 | Japan | 310/312 |

*Primary Examiner*—Peter S. Wong
*Attorney, Agent, or Firm*—Robert E. Burns; Emmanuel J. Lobato; Bruce L. Adams

[57] ABSTRACT

The GT-cut quartz resonator resonated by two longitudinal modes and provided with the masses for frequency-temperature characteristics adjustment and frequency adjustment. The frequency-temperature characteristics and the frequency of the GT-cut quartz resonator are adjusted by eliminating the masses. Consequently, the quartz resonator adjusted to the normal frequency and having the excellent frequency-temperature characteristics is attained. Further the GT-cut quartz resonator of small and thin size is attained by making the resonant portion and the supporting portions in one piece by photolithographic technique.

15 Claims, 28 Drawing Figures

MINIATURE GT-CUT QUARTZ RESONATOR

BACKGROUND OF THE INVENTION

The present invention relates generally to coupling resonators and more particularly to a GT-cut quartz resonator configured so as to be in two longitudinal modes.

Conventionally the GT-cut quartz resonators are recognized as the resonator having the best frequency temperature (f-T) characteristics, i.e., the frequency change is within 1-2 PPM within the temperature range of 0°–100° C.

Figure 1:
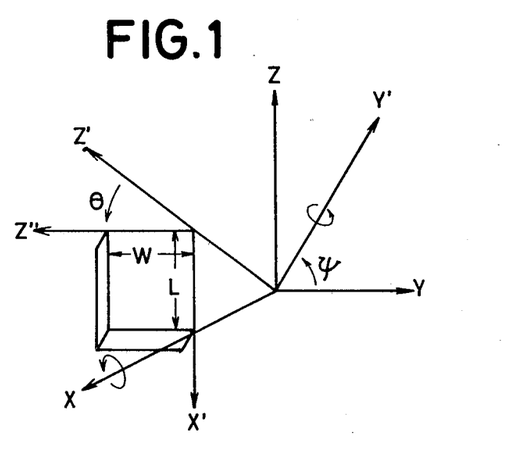
FIG. 1 is a perspective view showing the cut directions of a GT-cut resonator.

FIG. 1 shows the cut directions of a GT-cut quartz resonator. The resonator is formed from a Y plate is rotated around the X axis at $\phi = 49° - 56°$, then a GT-cut resonator is cut out as a plate rotated at $\theta = \pm(40° - 50°)$ within the new XZ' plane. The GT-cut quartz resonator can be resonated by coupling together two longitudinal modes respectively depending on the short side dimension W and the long side dimension L of the plate. The f-T characteristics depend on the cut angle $\phi$ and the side ratio $r = (W/L)$, and excellent f-T characteristics are obtained when $r = 0.86 - 0.98$.

Figure 2:
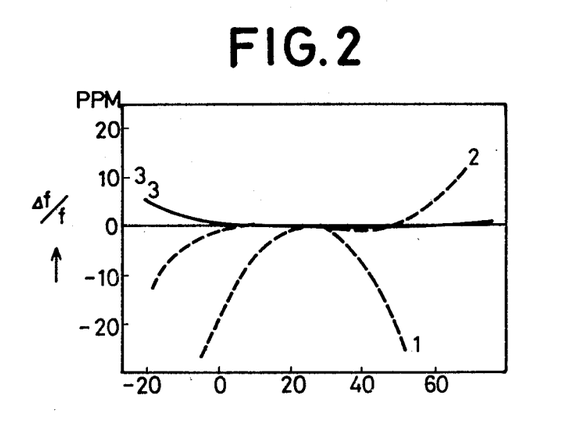
FIG. 2 is a graph showing the f-T characteristics of several types of resonators.

FIG. 2 shows examples of the f-T characteristics of several types of resonators. A curve 1 indicates the f-T characteristics of the flexural resonator of tuning fork shape which is typically used for wrist watches, a curve 2 indicates the f-T characteristics of the AT-cut thickness shear resonator which is widely used for electronic instruments and the like, and a curve 3 indicates the f-T characteristics of the conventional GT-cut contour shear resonator.

Generally, it is necessary to adjust the resonance frequency of the resonator at the desired frequency to fit the intended purposes of the resonator for resonators, and of high precision in particular, it is desirable to adjust the frequency dispersion to be less than $\pm(10-20)$ PPM. The f-T characteristics of the GT-cut resonator, however, are oversensitive to the coupling condition between the two coupled together resonant modes, so it is very difficult to adjust the frequency without deteriorating the f-T characteristics. In the conventional large rectangular GT-cut resonator produced by mechanical techniques, the frequency is roughly adjusted by grinding the short side, and then the dimensional ratio W/L is adjusted by grinding the long side. Further the frequency is adjusted more precisely by grinding the short side, and the dimensional ratio is adjusted by grinding the long side. In this way, the desired f-T characteristics are obtained and the frequency is adjusted by gradually grinding each side. This method, however, is disadvantageous in that the work processing is difficult and takes a long time, the rate of acceptance is bad, mass production of such resonators is difficult, and the cost is expensive.

BRIEF SUMMARY OF INVENTION

Accordingly, it is an object of the present invention to provide a miniature GT-cut quartz resonator whose resonance and having the excellent frequency-temperature characteristics (referred to as f-T characteristics hereafter).

It is another object of the present invention to provide an inexpensive GT-cut quartz resonator of miniature and thin size having excellent f-T characteristics.

Other and further objects, features and advantages of the invention will be apparent from the following description when read in connection with the accompanying drawings.

DETAILED DESCRIPTION OF THE INVENTION

Figure 3A:
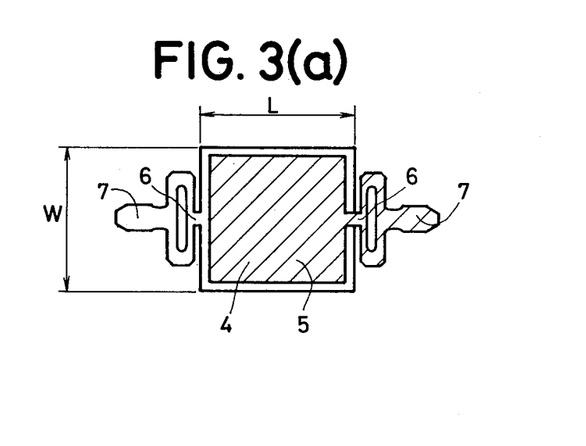
FIG. 3(a) is a plan view showing the shape of the resonator according to the present invention and FIG. 3(b) is a side view thereof.
Figure 3B:
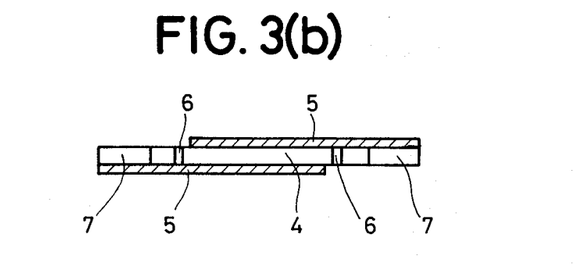

Referring first to FIG. 3, there is shown a plan view in FIG. 3(a) and a side view in FIG. b(b) of an embodiment of the resonator according to the present invention. A resonant portion 4 is of a rectangular shape having a length L and width W as shown in FIG. 3(a), and supporting portions 7 are provided at substantially the center of the short sides via bridge portions 6 at both ends thereof. The frequency of the short sides longitudinal mode which is the main mode depends on the width dimension W; and the frequency of the long sides longitudinal mode which couples with the former depends on the length dimension L. Exciting electrodes 5 are provided on almost the entire upper and lower major surfaces of the resonant portion 4, and the upper and lower exciting electrodes extend in the opposite direction and are disposed on the supporting portions 7 provided at both sides of the resonant portion 4. Although not shown, both the upper and lower exciting electrodes 5 may be disposed on the same supporting portion.

Figure 4A:
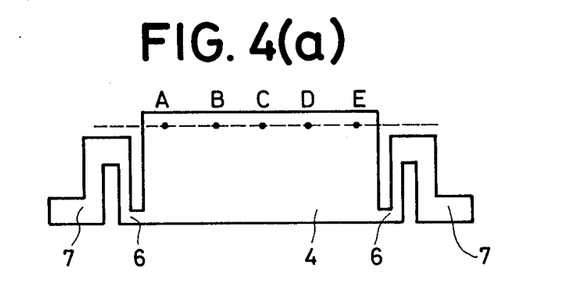
FIG. 4(a) is a partially broken plan view illustrating the principle of the resonator according to the present invention.
Figure 4B:
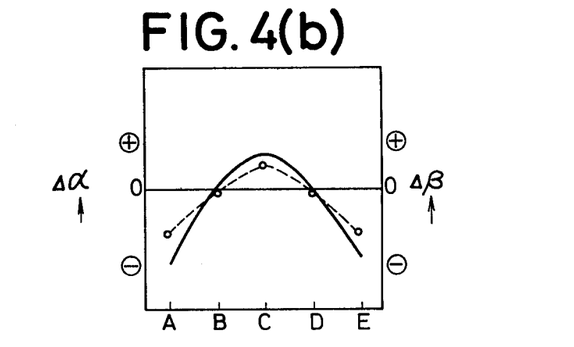
FIG. 4(b) is a graph showing the frequency deviation of the f-T characteristics.
Figure 4C:
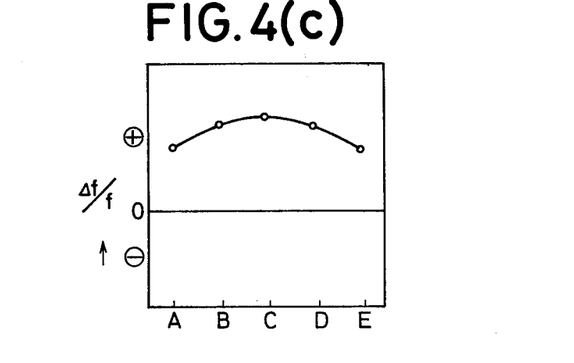
FIG. 4(c) is a graph showing the frequency deviation of the main resonance frequency verses the addition and reduction of the masses.

FIGS. 4(a)–4(c) show a plan view and graphs illustrating the principles of the frequency adjustment and the f-T characteristic adjustment of the resonator according to the present invention.

FIG. 4(a) is a plan view showing half of the resonator cut at the center in the long side direction.

FIG. 4(b) is a graph showing the deviations of the primary temperature coefficient $\alpha$ and the secondary temperature coefficient $\beta$ in the case in which masses deposited near the points A to E along the long sides of the resonant portion 4 are eliminated by a laser or the like. The graph teaches the following features. Namely, if the mass near the point A is eliminated, both $\alpha$ and $\beta$ rapidly change in the negative direction; if the mass near the point C is eliminated, both $\alpha$ and $\beta$ change in the positive direction; and if the mass near the point B or D is eliminated, both $\alpha$ and $\beta$ do not change, i.e., the f-T characteristics do not change at all.

FIG. 4(c) is a graph showing the deviation of the main resonance frequency in the case the masses near the points A to E are eliminated. The graph teaches that the main resonance frequency changes in the positive direction, i.e., the frequency becomes higher by eliminating the masses near any of the points A to E. Accordingly, by utilizing the feature that the main resonance frequency can be changed without changing the f-T characteristics if the masses near the points B and D are eliminated, the f-T characteristics and the frequency are adjusted by adopting the following methods or combination of the methods. (1) The masses can be deposited near the points B, C and D, and the mass near the point C on be eliminated to adjust the f-T characteristics, and then the frequency can be adjusted by adjusting the mass near the point B or D. (2) The masses can be deposited near at the points A, B, D and E, and the masses A and/or E can be eliminated to adjust the f-T characteristics, and then the frequency can be adjusted by eliminating the masses near the points B and D.

While the above noted principle has been illustrated using the method of eliminating the masses as an example, a similar effect can be attained by using the method of depositing or adding the masses by vacuum evaporation or sputtering although in such case the changes in $\alpha$ and $\beta$ are in the opposite direction from that in the above illustrated method.

Figure 5:
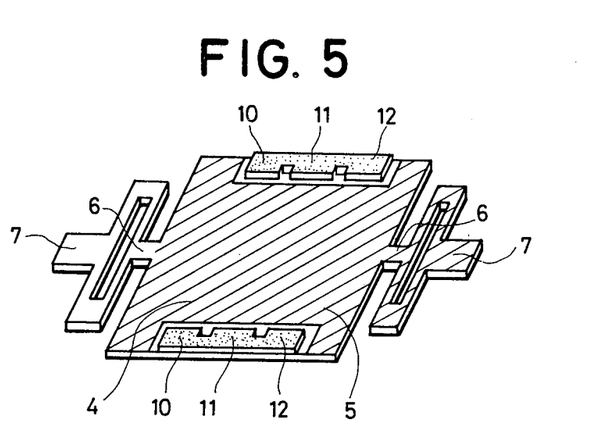
FIG. 5 is a perspective view showing an embodiment of the resonator according to the present invention.

FIG. 5 is a perspective view showing an embodiment of the resonator according to the present invention. Masses 10, 11 and 12 are provided along the long sides of the resonant portion 4. The exciting electrode 5 is shaped to accommodate the mass portions 10, 11 and 12 and extends over almost the entire surface of the resonant portion 4 and extends over the supporting portions 7 by way of the bridge portions 6. In this embodiment, the main resonance frequency is adjusted by the masses 10 and/or 12 after the f-T characteristics are adjusted by the masses 11.

Figure 6A:
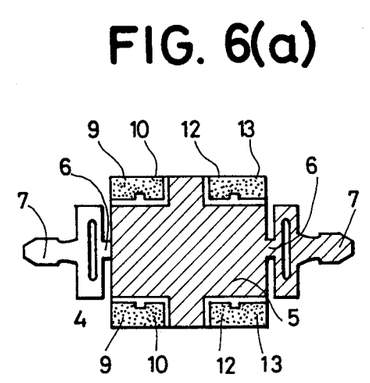
FIGS. 6(a) to 6(d) are plan views showing other embodiments of the resonator according to the present invention.
Figure 6B:
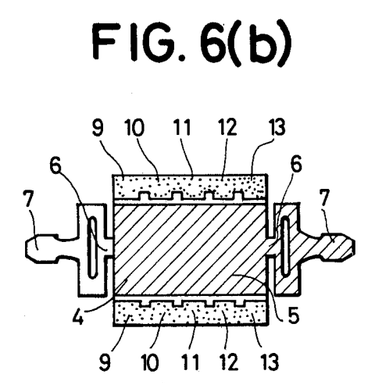
Figure 6C:
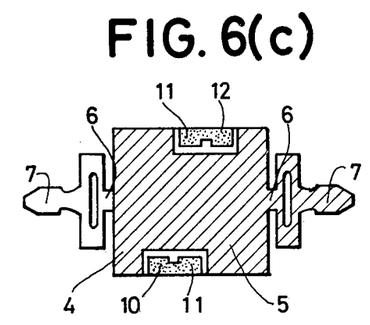
Figure 6D:
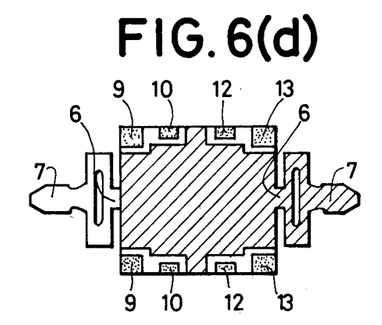

FIGS. 6(a) to 6(d) are plan views showing other embodiments of the resonator according to the present invention. In FIG. 6(a) the masses 9 and 13 are used to change the f-T characteristics in the negative direction and the masses 10 and 12 are used to adjust the frequency of the main mode without changing the f-T characteristics. The f-T characteristics are adjusted by the masses 9 and/or 13 and then the frequency is adjusted by the masses 10 and/or 12. In FIG. 6(b) a series of masses are provided along the long sides of the resonant portion, and the f-T characteristics are adjusted both in the positive and negative directions by the masses 9 and 13. FIG. 6(c) shows an embodiment using a decreased number of masses, in which the f-T characteristics are adjusted by the masses 10 and 12, and the frequency is adjusted by the mass 11. FIG. 6(d) shows an embodiment wherein each of the masses is provided separately, and in which the f-T characteristics are adjusted by the masses 9 and 13 and the frequency is adjusted by the mass 11. The frequency and the f-T characteristics are adjusted by depositing the masses on at least one portion out of the 4 portions where the f-T characteristics do not change and on at least one portion out of the 6 portions where the f-T characteristics change. These masses may be deposited both separately and in series as shown in FIG. 6. Further, the same effect is obtained by depositing the masses on one side and on both sides of the resonant portion.

Figure 7:
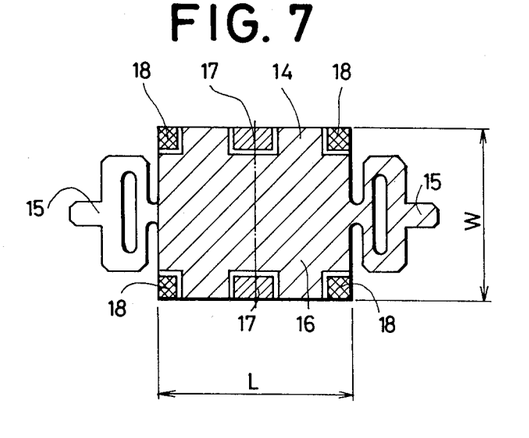
FIG. 7 is a plan view showing a further embodiment of the resonator according to the present invention.

FIG. 7 is a plan view showing another embodiment of the GT-cut quartz resonator according to the present invention. Supporting portions 15 are provided at substantially the center of the short sides of a resonant portion 14, and the resonant portion 14 and the supporting portions 15 are made in one piece. Exciting electrodes 16 are deposited on almost the entire overall upper and lower major surfaces of the resonant portion 14, and the masses 17 and 18 are used for adjusting the frequency and the f-T characteristics. The exciting electrodes 16 extend to the supporting portions 15 provided at both ends of the resonant portion 14 each in the opposite direction, i.e., the upper and lower electrodes extend in opposite directions. The masses 17 for frequency adjustment are deposited along the nodes of the longitudinal mode, and the masses 18 for f-T characteristics adjustment are deposited at the four corners of the resonant portion 14.

Figure 8A:
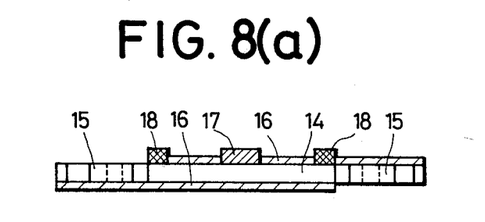
FIGS. 8(a) and 8(b) are side views showing further embodiments of the resonator according to the present invention.
Figure 8B:
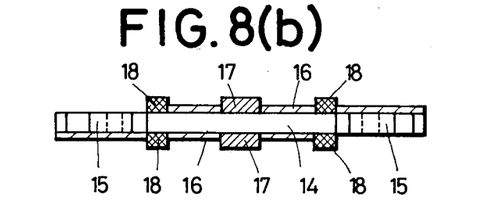

FIGS. 8(a) and 8(b) are side views of the resonator according to the present invention. In the embodiment of FIG. 8(a), the masses 17 and 18 for adjusting the frequency and the f-T characteristics as shown in FIG. 7 are deposited on one side of the resonant portion 14, while in the embodiment of FIG. 8(b), the masses 17 and 18 are deposited on both sides of the resonant portion 14.

Figure 9:
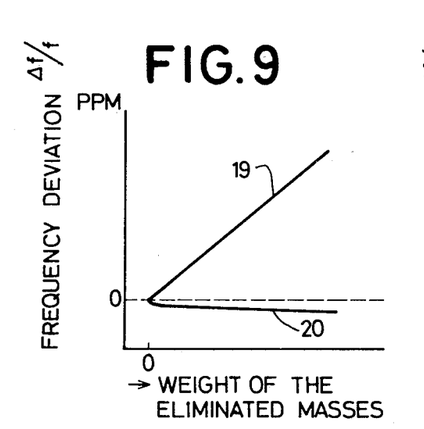
FIGS. 9 and 10 are graphs showing the frequency deviation verses the weight of the masses in the case the masses are eliminated.

FIG. 9 is a graph showing the frequency deviation of the longitudinal mode frequencies $H_F$ and $L_F$ of the short side and the long side of the resonator verses the weight of the eliminated masses 17 for frequency adjustment shown in FIG. 7, standardized on each the frequencies before the elimination of the masses 17. A curve 19 indicates the frequency deviation of the short side mode and a curve 20 indicates the frequency deviation of the long side mode. The frequency $H_F$ of the short side mode rises almost linearly as shown by the curve 19 by eliminating the masses 17. The frequency $L_F$ of the long side mode slightly falls but unchanged remains almost as shown by the curve 20 by eliminating the masses 17.

Figure 10:
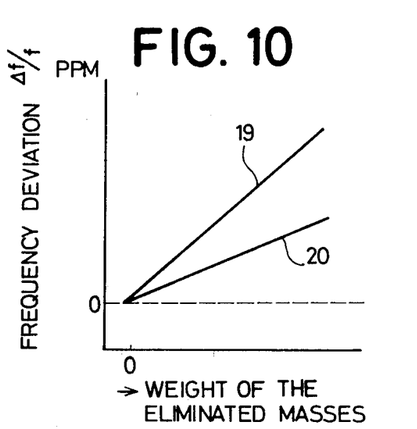

FIG. 10 is a graph showing the frequency deviation of the short side mode and the long side mode verses the weight of the eliminated masses 18 for adjusting the f-T characteristics as shown in FIG. 7. The curve 19 indicates the frequency deviation of the short side mode and the curve 20 indicates the frequency deviation of the long side mode. Both the frequency $H_F$ of the short side mode and the frequency $L_F$ of the long side mode rise almost linearly by eliminating the masses 18. The frequency deviation $L_F$ of the long side mode is less than ½ of the frequency deviation $H_F$ of the short side mode. As illustrated, the frequencies of the two longitudinal modes can be adjusted by eliminating the masses 17 and 18. It results in the same effect as changing the coupling condition of the two longitudinal modes by changing the side ratio $r=(W/L)$ as shown in FIG. 3(a). Therefore, the f-T characteristics of the short side main mode can be adjusted and the frequency $H_F$ can be adjusted at the desired value by appropriately eliminating the masses 17 and 18 without changing the side ratio.

Figure 11:
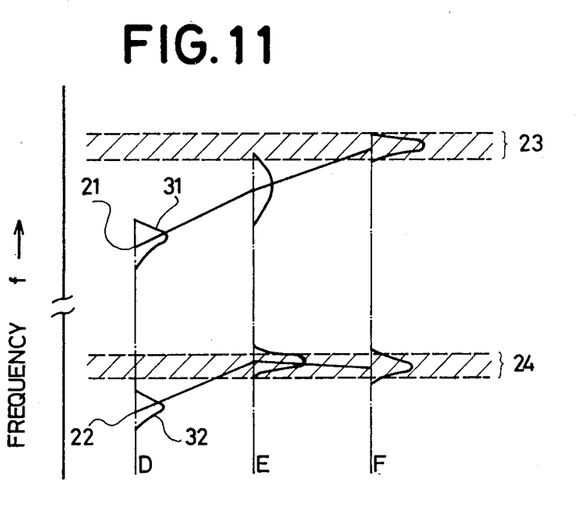
FIG. 11 is a graph showing an embodiment of the frequency-adjusting method of the resonator according to the present invention.

FIG. 11 shos an embodiment of the frequency adjustment of the resonator according to the present invention. Numeral 23 denotes the desired value of the short side resonant frequency $H_F$ of the main longitudinal mode. Numeral 24 denotes the desired value of the long side resonant frequency $L_F$ in the case the two longitudinal modes exhibit similar coupling condition as the optimum side ratio showing the excellent f-T characteristics. D indicates the condition before the frequency adjustment. Numeral 21 indicates the average value of the frequency of the short side mode, and numeral 31 indicates the dispersion thereof. Numeral 22 denotes the average value of the frequency of the long side mode, and numeral 32 indicates the dispersion thereof. Before the frequency adjustment D, the masses 17 and 18 are deposited so that the two frequencies may be lower than the desired values. Then the long side mode frequency $L_F$ is adjusted at the desired value 24 by eliminating the masses 18 for f-T characteristics adjustment shown in FIG. 7. The conditions of the short side mode and long side mode frequencies in the case the masses 18 are eliminated are shown along the E-axis in FIG. 11. Then the frequency $H_F$ of the short side mode is adjusted at the desired value 23 by eliminating the masses 17 for frequency adjustment in FIG. 7. The conditions of the short side and long side mode frequencies in the case the masses 17 are eliminated will be shown in FIG. 11F. The resonator having excellent f-T characteristics is easily and inexpensively attained by the above mentioned method.

Figure 12A:
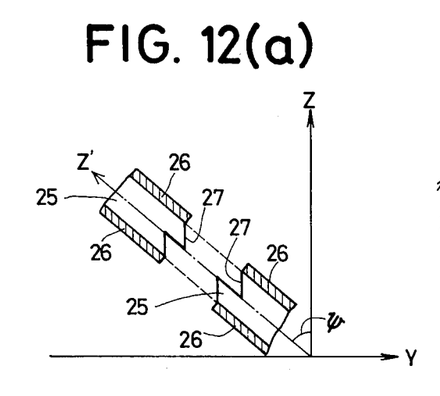
FIGS. 12(a) and 12(b) are partially broken sectional view illustrating different arrangements of the masks in the photolithographic process of the resonator according to the present invention.
Figure 12B:
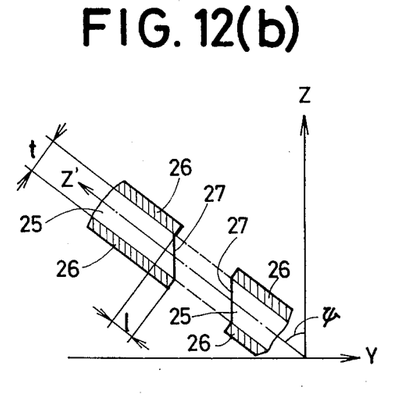

FIG. 12 shows partially broken sectional views illustrating the positions of the upper and lower masks in the case the quartz resonator according to the present invention is produced using the photolithographic technique. Reference numeral 25 denotes a crystal thin plate, 26 denotes upper and lower masks and 27 denotes etching sections of the quartz crystal thin plate. The etching velocity of the quartz crystal is the fastest in the direction of the Z-axis (optical axis). Therefore, in the case that the upper and lower masks are deposited to overlap each other in the normal direction of the quartz crystal thin plate, the etching section 27 of the quartz crystal plate which is rotated from the Z axis by $\phi$ is not level and it is very difficult to attain the dimensional precision as shown in FIG. 12(a). Therefore, in the quartz resonator according to the present invention, the upper and lower masks are shifted by an amount l in the Z' direction to obtain a level etching section. The amount of shift l of the masks is represented by $l=t/\tan\phi$ in the case the inclination from the Z axis of the quartz crystal thin plate is $\phi$ and the thickness of the plate is t. The quartz resonator in which the masks are shifted according to the present invention is produced exceedingly precisely and has excellent f-T characteristics with less dispersion.

Figure 13:
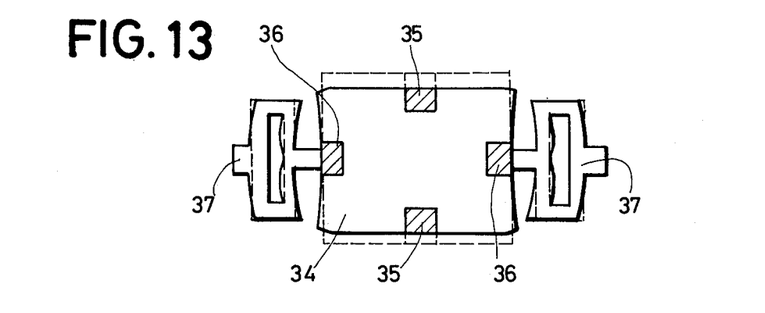
FIGS. 13 and 14 are plan views showing respectively the displacement of the mode of the resonator according to the present invention.
Figure 14:
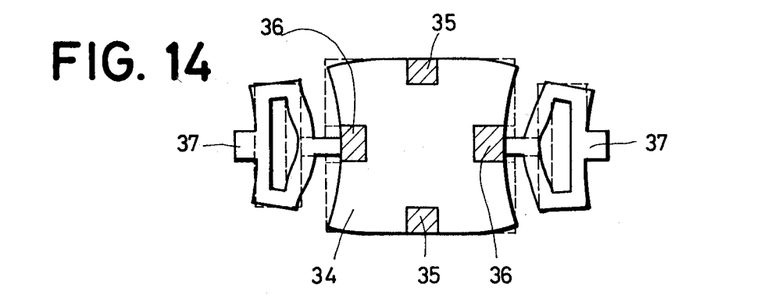

FIGS. 13 and 14 are plan views showing the displacements of the short side mode and the long side mode of the quartz resonator according to the present invention. A resonant portion 34 and supporting portions 37 of the resonator are made in one piece by the photoetching method or the like, and exciting electrodes (not shown) are deposited on substantially the entire overall upper and lower major surfaces of the resonant portion 34, and extend respectively to both the supporting portions 37. Oblique lined portions 35 and 36 respectively near the nodes of the long side longitudinal mode and the short side longitudinal mode indicate the portions to deposit or eliminate the masses for frequency adjustment.

FIG. 13 shows the displacement of the short side longitudinal mode, in which the oblique lined portions 35 undergo large displacement, while the oblique lined portions 36 near the node of the short side longitudinal mode undergo little displacement. Therefore, the short side longitudinal mode frequency $H_F$ is changed by the weight of the masses but is hardly affected by the masses at the oblique lined portions 36.

FIG. 14 shows the displacement of the long side longitudinal mode, in which the oblique lined portions 35 near the node of the long side longitudinal mode undergo little displacement, while the oblique lined portions 36 undergo large displacement. It teaches that the long side longitudinal mode frequency $L_F$ is changed by increasing or decreasing the weight of the masses at the oblique lined portions 36 in FIG. 14, while the frequency $L_F$ is not affected by the masses at the oblique lined portions 35.

Figure 15:
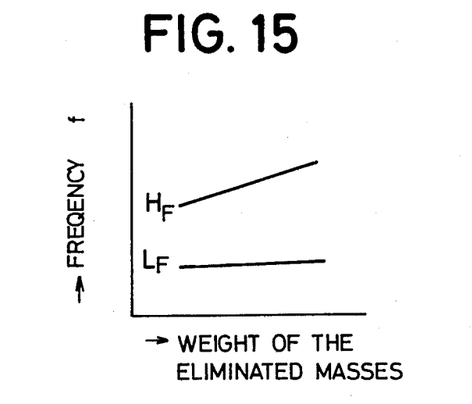
FIGS. 15 and 16 are characteristic diagrams showing the frequency changes in the short side and long side longitudinal modes in the case the masses are eliminated.
Figure 16:
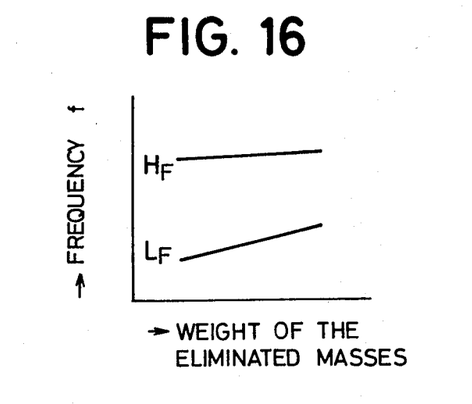

FIGS. 15 and 16 are curves showing the changes in the short side and the long side longitudinal mode frequencies in the case where the masses are eliminated by a laser or the like. FIG. 15 shows in the case where the masses at the oblique lined portions 35 in FIGS. 13 and 14 are eliminated and FIG. 16 shows in the case where the masses at the oblique lined portions 36 are eliminated. Thus the frequencies of the short side longitudinal mode and the long side longitudinal mode can be independently adjusted by adding or reducing the weight of the masses deposited on the resonant portion 34, whereby the coupling condition between the two longitudinal modes is accordingly changed. Namely the effect equivalent to the effect obtained by changing the side ratio $r=(W/L)$ is obtained by the above method. Consequently excellent f-T characteristics are attained only by the frequency adjustment without changing the side ratio.

Figure 17A:
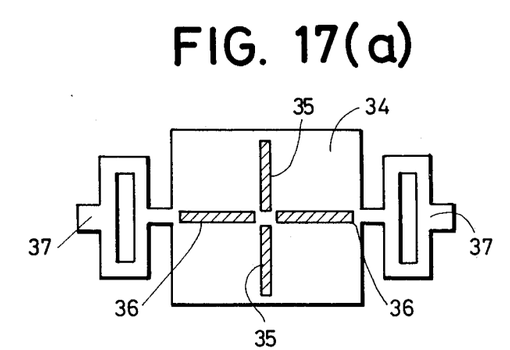
FIGS. 17(a) and 17(b) are plan views showing respectively further embodiments of the resonator according to the present invention.
Figure 17B:
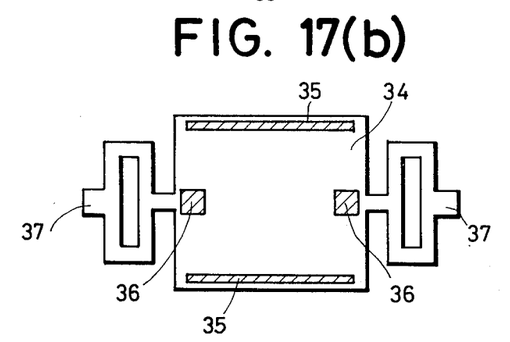

FIGS. 17(a) and 17(b) are further embodiments of the present invention, in which the resonant portion 34 and the supporting portions 37 are made in one piece in a similar manner as the embodiments in FIGS. 13 and 14. In the embodiment of FIG. 17(a), the masses 35 and 36 are deposited along the nodes of the long side longitudinal mode and the short side longitudinal mode, whereby a frequency adjustment finer than the embodiment illustrated above is obtained. In the embodiment of FIG. 17(b), the masses 35 for adjusting the frequency of one mode (the short side longitudinal mode in the drawing) extend in a direction meeting at a right angle with the resonance direction, whereby the frequency of the one mode is changed to a greater extent than that of the other mode.

Figure 18A:
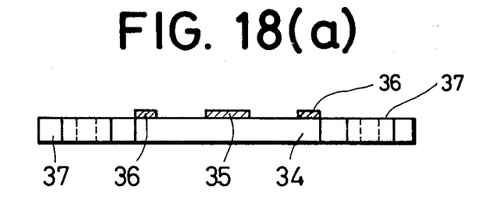
FIGS. 18(a) and 18(b) are side views showing other embodiments of the resonator according to the present invention.
Figure 18B:
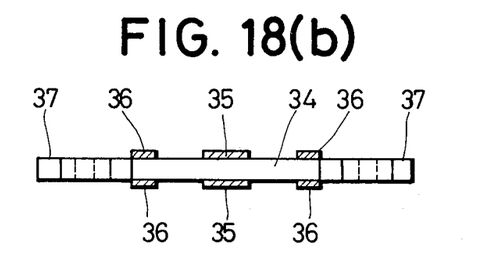

As shown by the side views in FIG. 18, the same effect is obtained by depositing the masses on one side (FIG. 18 (a)) or both sides (FIG. 18(b)) of the resonant portion.

According to the present invention, the f-T characteristics and the resonance frequency are easily and precisely adjusted by eliminating or depositing the masses as described herein above. Since the frequency and f-T characteristics are linearly deviated by the addition and reduction of the masses, the workability of the manufacturing process of the resonator is improved and can be easily automated. The frequency is independently adjusted after the f-T characteristics adjustment. The GT-cut resonator is inexpensively produced by a simplified manufacturing process.

Further the GT-cut quartz resonator according to the present invention can be mass-produced precisely by the photolithographic technique and the frequency and the f-T characteristics can be adjusted by eliminating the masses, whereby the resonator can be easily and speedily mass-produced in comparison with the conventional method of controlling the dimension (side ratio).

Further the GT-cut resonator is easily miniaturized by adjusting the f-T characteristics precisely. By simplifying the manufacturing process, the GT-cut resonator can be produced at low cost.

As illustrated in detail, the GT-cut resonator according to the present invention is expected to be widely applied in many fields in which high precision is required, such as timepieces and measuring instruments.

While I have shown and described certain present preferred embodiments of the invention, it is understood that the invention is not limited thereto but may be otherwise variously embodied within the scope of the following claims.

What is claimed is:

1. A GT-cut quartz resonator comprising: a quartz crystal thin plate having a resonant portion having opposed relatively short sides and opposed relatively long sides, at least one supporting portion, and at least one bridge portion connecting the resonant and supporting portions; said resonant, supporting and bridge portions all being integrally formed as a single piece from the quartz crystal thin plate, said thin plate comprising a quartz crystal Y plate rotated around the X axis through an angle of 49° to 56°, and the Y plate being further rotated through an angle of ±(40° to 50°) inside the major surfaces thereof; and masses disposed along portions of the long sides of the resonant portion at a first set of locations at which the frequency-temperature coefficient is not effectively changed by the addition or reduction of the amount of the masses and at a second set of locations at which both the frequency-temperature coefficient and the resonance frequency are effectively charged by the addition or reduction of the amount of the masses.

2. A GT-cut quartz resonator claimed in claim 1; wherein the masses are comprised of Au or Ag.

3. A GT-cut quartz resonator claimed in claim 1; including exciting electrodes deposited on almost the entire major surfaces of the resonant portion and being electrically insulated from said masses.

4. A GT-cut quartz resonator claimed in claim 1; wherein the portions along the short sides of the resonant portion are free of and do not have disposed thereon said masses.

5. A method for manufacturing a GT-cut quartz resonator having a resonant portion including opposed relatively short sides and opposed relatively long sides, at least one supporting portion, and at least one bridge portion connecting the resonant and supporting portions, comprising the steps of: adjusting the frequency-temperature coefficient by the addition or reduction of the amount of masses on the resonant portion where the frequency-temperature coefficient and the resonance frequency are effectively changed by the addition or reduction of the amount of the masses; and thereafter adjusting the resonance frequency by the addition or reduction of the amount of the masses on the resonant portion where the frequency-temperature coefficient is not effectively changed by the addition or reduction of the amount of the masses.

6. A coupling resonator comprising: a single piece of piezoelectric material having a resonant portion having opposed major surfaces and opposed relatively short sides and opposed relatively long sides, at least one supporting portion, and at least one bridge portion interconnecting the resonant and supporting portions and being configured to resonate at a preselected main resonance frequency; a first set of masses disposed on at least one major surface along the marginal edge portions of the long sides thereof at locations effective to adjust the frequency-temperature characteristics of the resonator; and a second set of masses disposed on at least one major surface along the marginal edge portions of the long sides thereof at locations effective to adjust the main resonance frequency of the resonator without disturbing the adjusted frequency-temperature characteristics effected by the first set of masses.

7. A coupling resonator according to claim 6; wherein the first and second sets of masses are disposed on both major surfaces.

8. A coupling resonator according to claim 7; including exciting electrodes disposed on both major surfaces, the exciting electrodes being electrically insulated from the masses.

9. A coupling resonator according to claim 6; wherein the first set of masses comprises masses disposed at both end portions of each of the long sides.

10. A coupling resonator according to claim 9; wherein the second set of masses comprises masses disposed along the long sides adjacent respective ones of the masses of the first set.

11. A coupling resonator according to claim 10; wherein the mid portions of the long sides are free of any masses.

12. A coupling resonator according to claim 6; wherein the first set of masses comprises masses disposed at the mid portions of the long sides.

13. A coupling resonator according to claim 12; wherein the second set of masses comprises masses disposed along the long sides adjacent both sides of respective ones of the masses of the first set.

14. A coupling resonator according to claim 13; wherein both end portions of the long sides are free of any masses.

15. A coupling resonator according to claim 6; wherein the single piece of piezoelectric material comprises a GT-cut piece of quartz.

* * * * *